:::::::
(12) United States Patent
Morigaki

(10) Patent No.: US 6,475,702 B2
(45) Date of Patent: *Nov. 5, 2002

(54) PHOTOSENSITIVE RESIN COMPOSITION AND PHOTORESIST INK FOR MANUFACTURING PRINTED WIRING BOARDS

(75) Inventor: Toshio Morigaki, Kyoto (JP)

(73) Assignee: Goo Chemical Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/928,307

(22) Filed: Aug. 14, 2001

(65) Prior Publication Data

US 2002/0022194 A1 Feb. 21, 2002

Related U.S. Application Data

(60) Continuation of application No. 09/584,492, filed on Jun. 1, 2000, which is a division of application No. 09/265,571, filed on Mar. 10, 1999, now Pat. No. 6,136,507.

(30) Foreign Application Priority Data

Mar. 12, 1998 (JP) ............................................. 10-61605

(51) Int. Cl.$^7$ ..................... G03C 1/73; C08K 2/46; C08J 3/28; C08F 2/46
(52) U.S. Cl. ..................... 430/287.1; 430/283.1; 430/285.1; 522/84; 522/85; 522/100; 522/121
(58) Field of Search .................. 430/287.1, 283.1, 430/285.1; 522/84, 121, 100, 85

(56) References Cited

U.S. PATENT DOCUMENTS

| | | | |
|---|---|---|---|
| 4,209,581 A | 6/1980 | Takanishi et al. | 430/283.1 |
| 4,272,620 A | 6/1981 | Ichimura et al. | 430/287.1 |
| 4,564,580 A | 1/1986 | Ichimura et al. | 430/287.1 |
| 6,322,952 B1 * | 11/2001 | Morigaki | 430/287.1 |

FOREIGN PATENT DOCUMENTS

| | | |
|---|---|---|
| EP | 0 747 770 A2 | 12/1996 |
| EP | 0 747 770 A3 | 4/1997 |
| EP | 0 779 553 A1 | 6/1997 |
| JP | 49-5923 | 2/1974 |
| JP | 55-23163 | 2/1980 |
| JP | 55-62905 | 5/1980 |
| JP | 56-11906 | 2/1981 |
| JP | 58115432 | 7/1983 |
| JP | 62-267302 | 11/1987 |
| JP | 5-224413 | 9/1993 |
| JP | 5-241340 | 9/1993 |
| JP | 6263832 | 9/1994 |
| JP | 6289215 | 10/1994 |
| JP | 8-114917 | 5/1996 |
| JP | 8-328251 | 12/1996 |
| JP | 8-328252 | 12/1996 |
| JP | 9-249823 | 9/1997 |

OTHER PUBLICATIONS

European Search Report dated Jul. 5, 1999 for EP Application No. 99104757.2–1217.

* cited by examiner

Primary Examiner—Janet Baxter
Assistant Examiner—Sin J. Lee
(74) Attorney, Agent, or Firm—Rader, Fishman & Grauer PLLC

(57) ABSTRACT

A photosensitive resin composition developable with water or a diluted alkali solution comprises the following components (A) to (D). That is, the component (A) is a water-soluble photosensitive resin selected from the group consisting of a first resin obtained by introducing a styryl pyridinium group into a polyvinyl alcohol polymer, a second resin obtained by introducing a styryl quinolinium group into the polyvinyl alcohol polymer, and a third resin obtained by adding N-alkylol(meth)acrylamide to the polyvinyl alcohol polymer. The component (B) is a photosensitive prepolymer having a carboxyl group and at least two ethylenically unsaturated groups in molecule. The component (C) is a photopolymerization initiator. The component (D) is water. The photosensitive resin composition will be preferably used as a photoresist ink for manufacturing printed wiring boards.

9 Claims, No Drawings

PHOTOSENSITIVE RESIN COMPOSITION AND PHOTORESIST INK FOR MANUFACTURING PRINTED WIRING BOARDS

This is a continuation of U.S. patent application Ser. No. 09/584,492, filed Jun. 1, 2000 which is a divisional of U.S. patent application Ser. No. 09/265,571 (now U.S. Pat. No. 6,136,507), filed on Mar. 10, 1999, the disclosure of which is hereby incorporated by reference.

BACKGROUND OF THE INVENTION

1. Field of the Invention

The present invention relates to a photosensitive resin composition developable with water or a diluted alkali aqueous solution, and a photoresist ink for manufacturing printed wiring boards.

2. Disclosure of the Prior Art

In the past, photoresist inks developable with a diluted alkali aqueous solution have been used as inks for manufacturing printed wiring boards, screen printing stencils, color-filter pixels and color-filter protective films, or a photogravure ink. For example, such photoresist inks are disclosed in Japanese Patent Early Publications No. 5-224413 and No. 5-241340.

However, these photoresist inks contain various organic solvents such that they can be uniformly applied on substrates. The organic solvents are usually evaporated from the photoresist inks during a predrying step prior to a subsequent exposing step. Therefore, there are problems inherent in the use of the organic solvents such as a poor working condition, environmental pollution and the occurrence of a fire.

SUMMARY OF THE INVENTION

The present invention concerns a photosensitive resin composition developable with water or a diluted alkali aqueous solution, which is capable of improving the above problems. The photosensitive resin composition contains the following components (A) to (D). That is, the component (A) is a water-soluble photosensitive resin selected from the group consisting of a first resin obtained by introducing a styryl pyridinium group into a polyvinyl alcohol polymer, a second resin obtained by introducing a styryl quinolinium group into the polyvinyl alcohol polymer, and a third resin adding N-alkylol(meth)acrylamide to the polyvinyl alcohol polymer. The component (B) is a photosensitive prepolymer having a carboxyl group and at least two ethylenically unsaturated groups in molecule. The component (C) is a photopolymerization initiator. The component (D) is water.

It is preferred that the photosensitive resin composition further contains a photopolymerizable ethylenically-unsaturated monomer as the component (E).

It is particularly preferred to use the photosensitive resin composition of the present invention as a photoresist ink for manufacturing printed wiring boards.

These and still other objects and advantages will become apparent from the following detail descriptions of the preferred embodiments and examples of the invention.

DETAIL DESCRIPTION OF THE PREFERRED EMBODIMENTS

In the present specification, "(meth)acrylic-" means "acrylic-" and "methacrylic-". For example, (meth)acrylic acid means acrylic acid and methacrylic acid. In addition, (meth)acrylamide means acrylamide and methacrylamide.

A photosensitive resin composition of the present invention comprises a water-soluble photosensitive resin (A), photosensitive prepolymer (B), photopolymerization initiator (C) and water (D).

The water-soluble photosensitive resin (A) is selected from the group consisting of a water-soluble photosensitive resin (A1) obtained by introducing a styryl pyridinium group or a styryl quinolinium group into a polyvinyl alcohol polymer, and a water-soluble photosensitive resin (A2) obtained by adding N-alkylol(meth)acrylamide to the polyvinyl alcohol polymer.

As the polyvinyl alcohol polymer used to prepare the photosensitive resin (A), for example, it is possible to use a polyvinyl alcohol obtained by complete saponification or a partial saponification of polyvinyl acetate, or a water-soluble polyvinyl alcohol derivative obtained by a reaction of —OH group or —OCOCH$_3$ group of a completely-saponified or partially-saponified polyvinyl alcohol with an acid-anhydride containing compound, carboxy-group containing compound, epoxy-group containing compound, or an aldehyde-group containing compound. In addition, it is possible to use a vinyl alcohol copolymer having vinyl alcohol units, which is obtained by the complete saponification or the partial saponification of polyvinyl acetate. As the copolymer component of vinyl acetate, for example, it is possible to use (meth)acrylic acid, (meth)acrylamide, N-methylol(meth)acrylamide, styrene, ethylene, propylene, maleic anhydride, (meth)acrylonitrile, (meth)acrylic ester.

It is preferred that the polyvinyl alcohol polymer contains 60 mol % or more of the vinyl alcohol units within its polymerization unit. In particular, when using the polyvinyl alcohol polymer containing 80 mol % or more of the vinyl alcohol units, or the polyvinyl alcohol obtained by the complete saponification of polyvinyl acetate, there is an advantage that the photosensitive resin composition of the present invention is excellent in the water-solubility.

The photosensitive resin (A1) can be prepared by a conventional method disclosed in, for example, Japanese Patent Early Publication [KOKAI] No. 55-23163, No. 55-62905, or No. 56-11906.

Concretely, for example, the photosensitive resin (A1) can be obtained by adding a formyl styryl pyridinium salt or a formyl styryl quinolinium salt to the polyvinyl alcohol polymer according to an acetal reaction applying an alcoholic —OH group of the polyvinyl alcohol polymer.

The general formula (1) shows a typical structure of an introduced portion of the styryl pyridinium group in the photosensitive resin (A1). The general formula (2) shows a typical structure of an introduced portion of the styryl quinolinium group in the photosensitive resin (A 1).

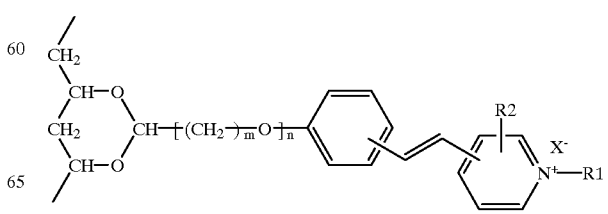

(1)

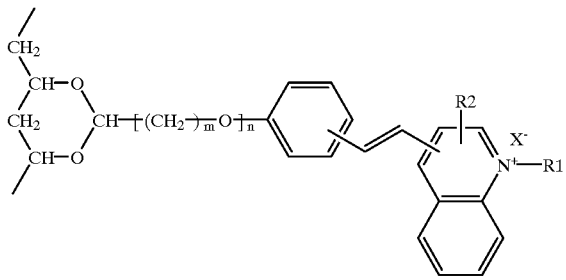

(2)

In these formulas (1) and (2), each of R1 and R2 is hydrogen atom, alkyl group, or aralkyl group, "X⁻" is a conjugate base of an acid, "m" is an integer of 1~6, and "n" is 0 or 1.

It is preferred that an introduction rate of the styryl pyridinium group or the styryl quinolinium group in the photosensitive resin (A1) is within a range of 0.3 to 20 mol %, and more preferably 0.5 to 10 mol %, per vinyl alcohol polymerization unit constructing the photosensitive resin (A1). In the range of 0.3 to 20 mol % of the introduction rate, the photosensitive resin (A1) is good in the water-solubility, and has a suitable photo-bridging capability.

The water-soluble photosensitive resin (A2) can be prepared by a conventional method disclosed in, for example, Japanese Patent Publication [KOKOKU] No. 49-5923, or Japanese Patent Early Publication [KOKAI] No. 62-267302. Concretely, for example, the photosensitive resin (A2) can be obtained by an etherification reaction between a polyvinyl alcohol polymer and N-alkylol(meth)acrylamide in the presence of an acid catalyst such as inorganic acid or sulfonic acid derivative in a good solvent of the polyvinyl alcohol polymer such as water or a N-methyl pyrrolidone solution, or a suspension of a bad solvent of the polyvinyl alcohol polymer.

As the N-alkylol(meth)acrylamide, for example, it is possible to use N-methylol(meth)acrylamide, N-ethylol (meth)acrylamide, N-propylol(meth)acrylamide, or N-butylol(meth)acrylamide. The N-alkylol(meth) acrylamide can be one of these materials or can be a combination of two or more of these materials, if necessary.

It is preferred that an addition ratio of the N-alkylol(meth) acrylamide is within a range of 0.05 to 25 mol %, and more preferably 0.05 to 15 mol %, per vinyl alcohol polymerization unit constructing the photosensitive resin (A2). In the above range of the addition ratio, better water-solubility and photo-curability of the photosensitive resin (A2) can be obtained.

The photosensitive prepolymer (B) is a photosensitive prepolymer having a carboxyl group and at least two ethylenically unsaturated groups in molecule. The photosensitive prepolymer is characterized in that a plurality of groups having photopolymerizable ethylenically-unsaturated groups branch from a main chain of the prepolymer. Since the photosensitive prepolymer contains the carboxyl group, it can be swelled, dispersed or dissolved in a diluted alkali aqueous solution. However, when the photosensitive prepolymer is exposed in the presence of the photopolymerization initiator, the ethylenically unsaturated groups of prepolymer molecules react each other to increase the molecular weight, so that the dispersing property or the solubility to the diluted alkali aqueous solution lowers.

Therefore, a film made of the photosensitive resin composition of the present invention containing the photosensitive prepolymer (B) can be swelled, dispersed or dissolved in the diluted alkali aqueous solution before the exposing step. However, after the film is cured by the exposing step according to photopolymerization, the dispersing property or the solubility to the diluted alkali aqueous solution lowers. Therefore, by applying a difference of the solubility of the photosensitive resin composition to the diluted alkali aqueous solution before and after the exposing step, it is possible to form a desired pattern of a cured film of the photosensitive resin composition. That is, the film of the photosensitive resin composition is selectively exposed, and then developed with the diluted alkali aqueous solution. The non-exposed region of the film is washed away to leave the exposed region of the film, so that the desired pattern of the cured film of the photosensitive resin composition is obtained.

The cured film of the photosensitive resin composition can be stripped and removed by the use of sodium periodate. Additionally, since the photosensitive resin composition of the present invention contains the photosensitive prepolymer (B) having the carboxyl group, the cured film can be stripped and removed by the use of an aqueous solution of alkali-metal hydroxide.

It is preferred that the photosensitive prepolymer (B) itself can form a film. In the present invention, since the photosensitive resin composition contains the photosensitive resin (A) and the photosensitive prepolymer (B), there is an advantage that a predried film of the photosensitive resin composition is substantially free from surface tackiness, so that contamination of a phototool artwork with the photosensitive resin composition can be prevented even when the artwork is directly put on the predried film.

It is preferred that an acid value of the photosensitive prepolymer (B) is within a range of 20 to 300 mgKOH/g, and more preferably 40 to 200 mgKOH/g. In this range of acid value, it is possible to shorten the developing time when developing the photosensitive resin composition with the diluted alkali aqueous solution. In addition, since the resistance to diluted alkali aqueous solution of the cured film of the photosensitive resin composition adequately lowers, a better pattern of the cured film can be easily formed.

It is also preferred that a weight-average molecular weight of the photosensitive prepolymer (B) is within a range of 2000 to 250000, and more preferably 4000 to 100000. In the above range of weight-average molecular weight, it is possible to stably obtain a sufficient photosensitivity of the photosensitive resin composition. In addition, when the weight-average molecular weight is less than 2000, there is a possibility that the surface tackiness of the predried film occurs. On the other hand, as the weight-average molecular weight exceeds 250000, there is a tendency of lowering the developing property.

The carboxyl group of the prepolymer (B) may be neutralized by an organic basic compound such as alkanol amine, alkali-metal hydroxide, or an inorganic basic compound such as ammonia.

As the prepolymer (B), for example, it is possible to use a photosensitive prepolymer (B 1) obtained by adding an ethylenically unsaturated monocarboxylic acid and an unsaturated or saturated polybasic acid anhydride to a polyfunctional epoxy compound having at least two epoxy groups.

As the polyfunctional epoxy compound of the prepolymer (B 1), for example, it is possible to use a phenol novolac-type epoxy resin, cresol novolac-type epoxy resin, bisphenol A-type epoxy resin, bisphenol A-novolac-type epoxy resin, bisphenol F-type epoxy resin, N-glycidyl-type epoxy resin, alicyclic-type epoxy resin (e.g., "EHPE-3150" manufactured by Daicel Chemical Industries, Ltd.), tris (hydroxyphenyl) methane-based polyfunctional epoxy resin (e.g., "EPPN-502H" manufactured by NIPPON KAYAKU Co., LTD. or "TACTIX-742" and "XD-905" manufactured by DOW CHEMICAL), dicyclopentadiene-phenol-type epoxy resin, naphthalene-type epoxy resin. As the ethytenically unsaturated monocarboxylic acid, for example, it is possible to use (meth)acrylic acid.

As the unsaturated or saturated polybasic acid anhydride of the prepolymer (B1), for example, it is possible to use a dibasic acid anhydride such as succinic anhydride, methyl succinic anhydride, maleic anhydride, citraconic anhydride, glutaric anhydride, itaconic anhydride, phthalic anhydride, tetrahydrophthalic anhydride, methyl tetrahydrophthalic anhydride, methyl nadic acid anhydride, hexahydrophthalic anhydride, and methyl hexahydrophthalic anhydride, or a polybasic acid anhydride such as trimellitic acid anhydride, pyromellitic acid anhydride, benzophenone tetracarboxylic anhydride and methyl cyclohexene tetracarboxylic anhydride.

In addition, as the prepolymer (B), it is possible to use a photosensitive prepolymer (B2) obtained by a reaction of a compound having a photoreactive ethylenically unsaturated group and a hydroxyl group in molecule with a copolymer of an unsaturated polybasic acid anhydride such as maleic anhydride and an aromatic hydrocarbon having a vinyl group such as styrene or vinyl alkyl ether.

As the compound of the prepolymer (B2), for example, it is possible to use 2-hydroxyethyl(meth)acrylate, 2-hydroxypropyl(meth)acrylate, 2-hydroxybutyl(meth) acrylate, diethylene glycol mono(meth)acrylate, dipropylene glycol mono(meth)acrylate, or dibutylene glycol mono (meth)acrylate.

Moreover, as the prepolymer (B), for example, it is possible to use a photosensitive prepolymer (B3) obtained by a reaction of an ethylenically unsaturated compound having a single epoxy group with a copolymer of a first ethylenically unsaturated monomer having no carboxyl group and a second ethylenically unsaturated monomer having the carboxyl group.

As the first ethylenically unsaturated monomer, for example, it is possible to use a straight-chained or branch-chained alkyl(meth)acrylate, alicyclic(meth)acrylate (an unsaturated bonding may be included in its ring.), ethylene glycol ester-type (meth)acrylate such as hydroxyethyl(meth) acrylate, methoxyethyl(meth)acrylate, propylene glycol-type (meth)acrylate, glycerol mono(meth)acrylate, aromatic-type (meth)acrylate such as benzyl(meth)acrylate, acrylamide-type compound such as (meth)acrylamide, N-methyl(meth)acrylamide, N-propyl(meth)acrylamide and diacetone(meth)acrylamide, vinyl pyrrolidone, acrylonitrile, vinyl acetate, styrene, α-methyl styrene, or vinyl ether.

As the second ethylenically unsaturated monomer, for example, it is possible to use (meth)acrylic acid, maleic acid, crotonic acid, or itaconic acid.

As the ethylenically unsaturated compound having the single epoxy group of the prepolymer (B3), for example, it is possible to use a glycidyl(meth)acrylate such as glycidyl (meth)acrylate and 2-methylglycidyl(meth)acrylate, or an epoxy cyclohexyl derivative of a (meth)acrylic acid such as (3,4-epoxy cyclohexyl)methyl(meth) acrylate.

As the prepolymer (B), for example, it is also possible to use a photosensitive prepolymer (B4) obtained by a reaction of a polymer or a copolymer containing an ethylenically unsaturated monomer having an epoxy group as polymerization unit with an unsaturated monocarboxylic acid and a saturated or unsaturated polybasic acid anhydride. The prepolymer (B4) can be prepared by conventional methods.

As the ethylenically unsaturated monomer having the epoxy group of the prepolymer (B4), for example, it is possible to use the ethylenically unsaturated compound having the single epoxy group of the prepolymer (B3).

When using the copolymer containing the ethylenically unsaturated monomer, it is possible to use an unsaturated monomer polymerizable with the ethylenically unsaturated monomer having the epoxy group. For example, the first ethylenically unsaturated monomer of the prepolymer (B3) may be used as the unsaturated monomer.

As the unsaturated monocarboxylic acid and the saturated or unsaturated polybasic acid anhydride of the prepolymer (B4), for example, it is possible to use those of the prepolymer (B1).

In addition, as the prepolymer (B), for example, it is possible to use a photosensitive prepolymer (B5) obtained by a reaction of parts of carboxyl groups in a cellulose derivative having carboxyl groups with a compound having an epoxy group and at least one ethylenically unsaturated group.

For example, the prepolymer (B5) can be prepared by the following method. That is, the compound having the epoxy group and at least one ethylenically unsaturated group is added to a hydrophilic solvent solution of the cellulose derivative in the presence of a polymerization inhibitor and a catalyst. The resultant is agitated and mixed to obtain a mixture. The mixture is kept at a reaction temperature of 60 to 150° C., and more preferably 80 to 120° C. to obtain the prepolymer (B5). As the polymerization inhibitor, it is possible to use hydroquinone or hydroquinone monomethyl ether. As the catalyst, it is possible to use a tertiary amine such as benzyl dimethyl amine and triethyl amine, a quaternary ammonium salt such as trimethyl benzyl ammonium chloride and methyl triethyl ammonium chloride, or triphenyl stibine.

As the cellulose derivative of the prepolymer (B5), for example, it is possible to use hydroxypropyl methylcellulose phthalate, hydroxypropyl methylcellulose acetate succinate, cellulose acetate hexahydrophthalate, hydroxypropyl methylcellulose acetate phthalate, or hydroxypropyl methylcellulose hexahydrophthalate.

As the compound having the epoxy group and at least one ethylenically unsaturated group of the prepolymer (B5), for example, it is possible to use a glycidyl(meth)acrylate such as glycidyl(meth) acrylate and 2-methyl glycidyl(meth) acrylate, or an epoxy cyclohexyl derivative of a (meth) acrylic acid such as (3,4-epoxy cyclohexyl) methyl(meth) acrylate.

By the way, when all of the carboxyl groups in the cellulose derivative reacts with epoxy groups, the prepolymer (B5) of the reaction product becomes to be insoluble to the diluted alkali aqueous solution. Therefore, an amount used of the compound having the epoxy group and at least one ethylenically unsaturated group should be determined such that parts of carboxyl groups of the cellulose derivative remain in the prepolymer (B5).

In addition, as the prepolymer (B), for example, it is possible to use a photosensitive prepolymer (B6) obtained by a reaction of a compound having a single epoxy group and at least one ethylenically unsaturated group and a saturated or unsaturated polybasic acid anhydride with a cellulose derivative having carboxyl groups.

For example, the prepolymer (B6) can be prepared by the following method. That is, a reaction product is obtained by a reaction of all or parts of the carboxyl groups of the cellulose derivative with the compound having the single epoxy group and at least one ethylenically unsaturated group. Then, the saturated or unsaturated polybasic acid anhydride is added to the reaction product to obtain the prepolymer (B6). As a method of preparing the reaction product, it is possible to use the same method explained for the prepolymer (B5). The addition reaction can be performed according to conventional methods.

As the cellulose derivative and the compound having the epoxy group and at least one ethylenically unsaturated group of the prepolymer (B6), for example, it is possible to use those of the prepolymer (B5). As the saturated or unsaturated polybasic acid anhydride of the prepolymer (B6), for example, it is possible to use those of the prepolymer (B 1).

As the photopolymerization initiator (C), for example, it is possible to use benzoin, alkyl ether of benzoin such as benzoin methyl ether, benzoin ethyl ether and benzoin isopropyl ether, acetophenone such as acetophenone, 2,2-dimethoxy-2-phenyl acetophenone, 2,2-diethoxy-2-phenyl acetophenone, 1,1-dichioro acetophenone, 1-hydroxy cyclohexyl phenyl ketone, and 4-(2-hydroxyethoxy)phenyl-(2-hydroxy-2-propyl) ketone, anthraquinone such as 2-methyl anthraquinone and 2-amyl anthraquinone, thioxanthone such as 2,4-dimethyl thioxanthone, 2,4-diethy thioxanthone, 2-chloro thioxanthone, 2,4-diisopropyl thioxanthone and 1-chloro-4-propoxy thioxanthone, ketal such as acetophenone dimethyl ketal and benzyl dimethyl ketal, xanthone, benzophenone such as 3,3-dimethyl-4-methoxy benzophenone, 3,3',4, 4'-tetra-(tert-butyl peroxyl carbonyl) benzophenone and 4-benzoyl-4'-methyl diphenyl sulfido, nitrogen-containing compound such as 2-methyl-1-[4-(methylthio)phenyl]-2-morpholino-1-propane-1-on, 2benzoyl-2-dimethyl amino-1(4-morpholino phenyl)-butanone-1, and 4,-4'-bis-diethyl amino benzophenone, or 2,4,6-trimethyl benzoyl diphenyl phosphine oxide. The photopolymerization initiator can be one of these materials, or can be a combination of two or more of these materials, if necessary.

The photopolymerization initiator (C) may be used together with a conventional photopolymerization enhancer or sensitizer such as a benzoic acid, and a tertiary amine, e.g., p-dimethyl amino benzoic acid ethyl ester, p-dimethyl amino benzoic acid isoamyl ester, and 2-dimethyl amino ethyl benzoate.

As a first optional component, the photosensitive resin composition of the present invention can contain a photopolymerizable ethylenically unsaturated monomer (E). As the monomer (E), for example, it is possible to use trimethylol propane tri(meth)acrylate, pentaerythritol tri(meth)acrylate, pentaerythritol tetra(meth)acrylate, dipentaerythritol penta(meth)acrylate, dipentaerythritol hexa(meth)acrylate, 1,4-butanediol diacrylate, 1,6-hexane diol di(meth)acrylate, neopentyl glycol di(meth)acrylate, tripropylene glycol di(meth)acrylate, 2,2-bis[4-((meth)acryloxy ethoxy) phenyl]propane, 2,2-bis[4-((meth)acryloxy diethoxy) phenyl]propane, 2-hydroxy-1,3-di(meth)acryloxy propane, ethylene glycol di(meth)acrylate, diethylene glycol di(meth) acrylate, triethylene glycol di(meth)acrylate, phenoxy ethyl (meth)acrylate, phenoxy diethylene glycol(meth)acrylate, methoxy diethylene glycol(meth)acrylate, tetrahydro furfuryl(meth)acrylate, dicyclopentenyl hydroxy ethyl (meth)acrylate, 1-methoxy dodecadienyl(meth)acrylate, β-(meth)acryloyl hydroxy ethyl hydrogen phthalate, β-(meth)acryloyl hydroxy ethyl hydrogen succinate, 3-chloro-2-hydroxy propyl(meth)acrylate, lauryl(meth)acrylate, cetyl(meth)acrylate, stearyl(meth)acrylate, bisphenol A-diepoxy acrylic acid adduct, (meth)acrylamide, N-methoxy methyl(meth)acrylamide, N,N-dimethyl(meth)acrylamide, (meth)acryloyl morpholine, N-methylol(meth) acrylamide, hydroxy propyl(meth)acrylate, polyethylene glycol di (meth)acrylate, methylene bis(meth)acrylamide, 2-hydroxy ethyl (meth)acrylate,2,2-bis[4-methacryloyl hydroxy polyethoxy phenyl]propane. The monomer (E) can be one of these materials or can be a combination of two or more of these materials, if necessary.

As a second optional component, the photosensitive resin composition of the present invention can contain an organic solvent. An amount used of the organic solvent should be determined such that the problems inherent in the use of the organic solvent are ignorable. For example, as the organic solvent, it is possible to use an alcohol such as ethanol, propanol, 2-propanol, butanol, 2-butanol, hexanol, ethylene glycol, diethylene glycol, triethylene glycol, propylene glycol, dipropylene glycol, butylene glycol, trimethylol propane, neopentyl glycol, glycerin, 1,2,4-butanetriol, 1,2-butanediol, 1,4-butanediol and diacetone alcohol, ethylene glycol alkyl ether such as ethylene glycol monomethyl ether, ethylene glycol monoethyl ether and ethylene glycol monobutyl ether, polyethylene glycol alkyl ether such as diethylene glycol monomethyl ether, diethylene glycol monocthyl ether and triethylene glycol monomethyl ether, propylene glycol alkyl ether such as propylene glycol monomethyl ether, polypropylene glycol alkyl ether such as dipropylene glycol monomethyl ether, acetic ester such as ethylene glycol monomethyl ether acetate, diethylene glycol monomethyl ether acetate, propylene glycol monomethyl ether acetate, dipropylene glycol monomethyl ether acetate, glycerin monoacetate and glycerin diacetate, lactic ester such as lactic ethyl and lactic butyl, dialkyl glycol ether such as diethylene glycol diethyl ether, ketone such as methyl ethyl ketone, cyclohexanone and isophorone, aromatic hydrocarbon such as toluene and xylene, oil and aromatic-type mixed solvent such as "SWASOL SERIES" (manufactured by Maruzen Petrochemical Co., Ltd.) and "SOLVESSO SERIES" (manufactured by EXXON CHEMICAL COMPANY), n-hexane, cyclohexane, or tetrahydrofuran. The organic solvent can be one of these materials, or can be a combination of two or more of these materials, if necessary.

The photosensitive resin composition of the present invention may also contain a leveling agent such as a fluorine surface active agent, silicone and a (meth)acrylate copolymer, a thixotropic agent such as AEROSIL, a polymerization inhibitor such as hydroquinone, hydroquinone monomethyl ether, pyrogallol, tert-butyl catechol and phenothiazine, antihalation agent, flame retardant, plating-resistance improving agent, defoamer, anti-oxidant, pigment wetting agent, organic or inorganic pigment and dye, additives such as synthetic rubber powder and natural rubber powder, high molecular dispersing agent or surface-active agent for improving the dispersion stability.

It is preferred to prepare the photosensitive resin composition of the present invention according to the following compounding amounts of the water-soluble photosensitive resin (A), photosensitive prepolymer (B), photopolymerization initiator (C) and water (D).

That is, it is preferred that the compounding amount of the water-soluble photosensitive resin (A) is 0.1 to 50 wt %, and more preferably 1 to 30 wt % with respect to the total amount of all components of the photosensitive resin composition except for water (D) and the organic solvent as the second optional component. In the above range, there are advantages that (1) the photosensitive resin composition is excellent in the water-solubility; (2) a cured film of the photosensitive resin composition exhibits good water resistance; and (3) a peeling of the cured film is hardly generated at the time of the formation of the cured film. In particular, when the compounding amount is 0.5 to 50 wt %, the photosensitive resin composition can be easily developed with water.

It is preferred that the compounding amount of the photosensitive prepolymer (B) is 30 wt % or more with respect to the total amount of all components of the photosensitive resin composition except for water (D) and the organic solvent as the second optional component. In the above range, there is an advantage that a predried film of the photosensitive resin composition is almost free from the surface tackiness.

It is preferred that the compounding amount of the photopolymerization initiator (C) is within a range of 0.1 to 20 wt % with respect to the total amount of all components of the photosensitive resin composition except for water (D) and the organic solvent as the second optional component. In the above range, there is an advantage that the photosensitive resin composition is excellent in the photo-curability.

It is preferred that the compounding amount of water (D) is within a range of 10 to 97 wt % with respect to the total amount of all components of the photosensitive resin composition. In the above range, there is an advantage that the fluidity of the photosensitive resin composition is suitable to uniformly apply the resin composition on substrates. When the photosensitive resin composition contains the ethylenically unsaturated monomer (E), it is preferred that the compounding amount of the monomer (E) is 75 wt % or less with respect to the total amount of all components of the photosensitive resin composition except for water (D) and the organic solvent as the second optional component. The monomer (E) is useful to more improve the photoreactivity of the photosensitive resin composition. When the compounding amount is more than 75 wt %, there is a possibility that the surface tackiness of the predried film of the photosensitive resin composition comes into problem.

There is no limitation as to a method of preparing the photosensitive resin composition of the present invention. For example, the components (A) to (C) and the other optional components may be dissolved, emulsified, and dispersed in water (D) or a mixture of water and an aqueous organic solvent to obtain the photosensitive resin composition. Alternatively, an aqueous solution of the component (A) may be added to the components (B) and (C) and the other optional components, and then mixed to obtain the photosensitive resin composition. In these methods, it is preferred to use an agitator or a muller such as homomixer, pipeline homomixer, bead mill, roll mill and ball mill.

Next, a method of forming a required pattern on a substrate with the use of the photosensitive resin composition of the present invention is explained as an example.

<Applying Step>

First, the photosensitive resin composition can be applied on a substrate by a dipping method, spray method, spin-coating method, roll method. A copper clad laminate used to manufacture printed wiring boards may be used as the substrate.

<Predrying Step>

The photosensitive resin composition on the substrate can be dried by a hot-air drying method, electromagnetic induction heating, hot-pressing, or a far-infrared drying method to obtain a predried film.

<Exposing Step>

After a mask having a required pattern such as a phototool artwork is directly or indirectly put on the predried film, ultraviolet can be radiated to the predried film through the mask by using a tungsten lamp, chemical lamp, low-pressure mercury lamp, medium-pressure mercury lamp, high-pressure mercury lamp, extra-high-pressure mercury lamp, xenon lamp or a metalhalide lamp. Alternatively, it is preferred to adopt a laser patterning method using a helium-cadmium laser, argon laser or a YAG laser.

<Developing Step>

After the exposing step, the predried film can be developed with water or a diluted alkali aqueous solution, so that the non-exposed region of the predried film is washed away to leave the exposed region of the predried film on the substrate as a resist pattern. When developing with the diluted alkali aqueous solution, it is preferred to use an aqueous solution of an alkali hydroxide such as sodium hydroxide, potassium hydroxide and lithium hydroxide, or an alkali carbonate such as sodium carbonate and potassium carbonate.

<Etching or Plating Step>

The etching or plating step can be performed to the substrate surface exposed through the resist pattern by conventional methods. When performing the etching step, it is preferred to select an etching agent in accordance with a material of a conductive layer of the substrate. For example, an acid etching solution such as copper (II) chloride, or an ammonia etching solution may be used. When performing the plating step, it is possible to perform a copper plating such as a copper-sulfate plating and a copper pyrophosphate plating, solder plating such as a high throw solder plating, nickel plating such as a nickel sulfamate plating, or a gold plating such as a soft gold plating and a hard gold plating.

<Removing Step of Resist Pattern>

When it is required to strip and remove the resist pattern from the substrate, the resist pattern can be readily stripped and removed with the use of sodium periodate or sodium hypochlorite. Alternatively, it is possible to remove the resist film from the substrate with the use of a stronger alkali aqueous solution than the alkali aqueous solution used at the developing step.

Consequently, the photosensitive resin composition of the present invention can provide the following advantages.

(1) Since the photosensitive resin composition does not essentially contain the organic solvent, it is possible to prevent the occurrence of the problems inherent in the use of the organic solvent.

(2) A predried film of the photosensitive resin composition can be developed with water or a diluted alkali aqueous solution.

(3) A film of the photosensitive resin composition cured by the photopolymerization reaction is excellent in film hardness, resistance to etching solution, resistance to plating solution, and thermal resistance. In addition, the cured film has good adhesion with the substrate.

(4) The cured film of the photosensitive resin composition can be removed from the substrate with the use of sodium periodate or an aqueous solution of an alkali-metal hydroxide.

Therefore, the photosensitive resin composition of the present invention will be preferably used as a photoresist ink for manufacturing printed wiring boards such as an etching resist ink, plating resist ink, solder resist ink and marking ink, photoresist ink for photogravure, photosensitive composition for manufacturing screen printing stencils, ink for manufacturing color-filter pixels, or an ink for manufacturing color-filter protective films.

EXAMPLES AND COMPARATIVE EXAMPLES

The followings are preferred examples of the present invention. However, needless to say, the present invention is not limited to these examples. The units "parts" and "%" used in the examples means "parts by weight" and "wt %", respectively. In addition, "weight-average molecular weight" was measured by a GPC (Gel Permeation Chromatography) method under the following condition.

[GPC Measuring Condition]
GPC Measuring Apparatus:
SHODEX SYSTEM 11 manufactured by Showa Denko K.K.
Column: SHODEX KF-800P, KF-805, KF-803 and KF-801 in series
Transfer Layer: THF (Tetrahydrofuran)
Flow Rate: 1 ml/min.
Column Temperature: 45° C.
Detector: RI
Conversion: Polystyrene In the GPC measurement, a THF (tetrahydrofuran) solution having a concentration of 10 mg/ml with respect to a solid part of each sample was prepared, and the injection amount is 100 μl.

[Preparation of Photosensitive Resin Aqueous Solution (S-1)]

200 g of a partially-saponified polyvinyl acetate "GOHSENOL GH-17" (manufactured by The Nippon Synthetic Chemical Industry Co., Ltd., Degree of polymerization: 1700, Degree of saponification: 88 mol %) was dissolved in 1774 g of water to obtain a first mixture. After 20 g of N-methyl-4-(p-formyl styryl) pyridinium methosulfate was added to the first mixture to obtain a second mixture, 6 g of an 85% phosphoric acid aqueous solution was added to the second mixture to obtain a third mixture. The third mixture was kept at 80° C. for 7 hours to obtain the photosensitive resin aqueous solution (S-1), which corresponds to an aqueous solution of the water-soluble photosensitive resin (A1).

[Preparation of Photosensitive Resin Aqueous Solution (S-2)]

200 g of a partially-saponified polyvinyl acetate "PVA-224" (manufactured by Kuraray Co., Ltd., Degree of polymerization: 2400, Degree of saponification: 88 mol %) was dissolved in 1774 g of water to obtain a first mixture. After 20 g of N-methyl-4-(p-formyl styryl) quinolinium methosulfate was added to the first mixture to obtain a second mixture, 6 g of an 85% phosphoric acid aqueous solution was added to the second mixture to obtain a third mixture. The third mixture was kept at 70° C. for 5 hours to obtain the photosensitive resin aqueous solution (S-2), which corresponds to an aqueous solution of the water-soluble photosensitive resin (A1).

[Preparation of Photosensitive Resin Aqueous Solution (S-3)]

200 g of a partially-saponified polyvinyl acetate "GOHSENOL GH-17" (manufactured by The Nippon Synthetic Chemical Industry Co., Ltd., Degree of polymerization: 1700, Degree of saponification: 88 mol %) was dissolved in 1000 g of water to obtain a first mixture. 40 g of N-methylol acrylamide was dissolved in the first mixture to obtain a second mixture, and then 2 g of a 0.1% methoxy hydroquinone aqueous solution and 3 g of an 85% phosphoric acid aqueous solution were added to the second mixture to obtain a third mixture. After the third mixture was kept at 60° C. for 20 hours, the third mixture was neutralized with a 5% caustic soda aqueous solution to obtain a fourth mixture. Water was also added to the fourth mixture such that its total weight is 1500 g, to thereby obtain the photosensitive resin aqueous solution (S-3), which corresponds to an aqueous solution of the water-soluble photosensitive resin (A2).

[Preparation of Photosensitive Resin Aqueous Solution (S-4)]

200 g of a partially saponified of a vinyl acetate polymer-unsaturated carboxylic acid Na copolymer "KL318" (manufactured by Kuraray Co., Ltd., Degree of polymerization: 1800, Degree of saponification: 88 mol %) was dissolved in 1000 g of water to obtain a first mixture. 60 g of N-methylol acrylamide was dissolved in the first mixture to obtain a second mixture, and then 2 g of a 0.1% methoxy hydroquinone aqueous solution and 3 g of an 85% phosphoric acid aqueous solution were added to the second mixture to obtain a third mixture. After the third mixture was kept at 80° C. for 5 hours, the third mixture was neutralized with a 5% caustic soda aqueous solution to obtain a fourth mixture. Water was also added to the fourth mixture such that its total weight is 1625 g to obtain the photosensitive resin aqueous solution (S-4), which corresponds to an aqueous solution of the water-soluble photosensitive resin (A2).

[Preparation of Photosensitive Prepolymer Solution (P-1)]

214 parts of a cresol novolac-type epoxy resin "EPICLON N-680" (manufactured by DAINIPPON INK AND CHEMICALS INCORPORATED, Epoxy Equivalents: 214) was dissolved in 60 parts of methyl ethyl ketone at a raised temperature under an airflow to obtain a first mixture. Next, 74 parts of acrylic acid, 0.1 parts of hydroquinone, and 2.0 parts of dimethyl benzylamine were added to the first mixture to obtain a second mixture. The second mixture was held at 80° C. for 24 hours to obtain a third mixture. After the third mixture was cooled, 136 parts of methyl ethyl ketone and 76 parts of tetrahydro phthalic anhydride were added to the third mixture to obtain a fourth mixture. The fourth mixture was kept at 80° C. for 10 hours while being agitated, to obtain a 65% photosensitive prepolymer solution (P-1), which corresponds to a solution of the photosensitive prepolymer (B1). The weight-average molecular weight and the acid value of the prepolymer solution (P-1) are 12000 and 77 mgKOH/g, respectively.

[Preparation of Photosensitive Prepolymer Solution (P-2)]

150 parts of a styrene-maleic anhydride copolymer "SMA-1000A" (manufactured by ELF ATOCHEM JAPAN, INC.) was dissolved in 149 parts of methyl ethyl ketone at a raised temperature under an airflow to obtain a first mixture. Next, 51 parts of 2-hydroxy ethyl acrylate, 0.1 parts of hydroquinone, and 3 part of dimethyl benzylamine were added to the first mixture to obtain a second mixture. After the second mixture was held at 80° C. for 12 hours to obtain a third mixture. 22 parts of n-butanol was added to the third mixture, and then held for 24 hours to obtain a 60% photosensitive prepolymer solution (P-2), which corresponds to a solution of the photosensitive prepolymer (B2). The weight-average molecular weight and the acid value of the prepolymer solution (P-2) are 7500 and 156 mgKOH/g, respectively.

[Preparation of photosensitive prepolymer solution (P-3)]

20 parts of methacrylic acid, 80 parts of methyl methacrylate, 100 parts of methyl ethyl ketone, 0.5 parts of lauryl mercaptan and 4 parts of azobis isobutyronitrile were put in a four-mouth flask, and held at 75° C. for 5 hours at a raised temperature under a nitrogen flow to obtain a 50% copolymer solution. The four-mouth flask has a thermometer, glass tube for nitrogen substitution, agitator, and a reflux condenser. Next, 15 parts of glycidyl methacrylate, 0.05 parts of hydroquinone and 2.0 parts of dimethyl benzylamine were added to the copolymer solution, and held at 80° C. for 24 hours under an air flow. Then, 13 parts of methyl ethyl ketone were added to the resultant to obtain a 50% photosensitive prepolymer solution (P-3), which corresponds to a solution of the photosensitive prepolymer (B3). The weight-average molecular weight and the acid value of the prepolymer solution (P-3) are 15000 and 62 mgKOH/g, respectively.

[(Preparation of Photosensitive Prepolymer Solution (P-4)]

70 parts of glycidyl methacrylate, 10 parts of methyl methacrylate, 20 parts of tert-butyl methacrylate, 100 parts of methyl ethyl ketone, 0.5 parts of lauryl mercaptan and 3 parts of azobis isobutyronitrile were put in a four-mouth flask, and held at 75° C. for 5 hours at a raised temperature under a nitrogen flow to obtain a 50% copolymer solution. The four-mouth flask has a thermometer, glass tube for nitrogen substitution, agitator, and a reflux condenser. Next, 0.05 parts of hydroquinone, 37 parts of acrylic acid and 2.0 parts of dimethyl benzylamine were added to the copolymer solution, and held at 80° C. for 24 hours under an air flow. Then, 38 parts of tetrahydrophthalic anhydride and 73 parts of methyl ethyl ketone were added to the resultant, and held at 80° C. for 10 hours to obtain a 50% photosensitive prepolymer solution (P-4), which corresponds to a solution of the photosensitive prepolymer (B4). The weight-average molecular weight and the acid value of the prepolymer solution (P-4) are 22000 and 80 mgKOH/g, respectively.

[Preparation of Photosensitive Prepolymer Solution (P-5)]

30 parts of hydroxypropyl methylcellulose acetate succinate "AS-L" (manufactured by Shin-Etsu Chemical Co., Ltd.), 80 parts of methyl ethyl ketone, 0.05 parts of hydroquinone, 2.6 parts of glycidyl methacrylate and 2.0 parts of dimethyl benzylamine were put in a four-mouth flask, and held at 80° C. for 24 hours. The four-mouth flask has a thermometer, agitator, and a reflux condenser. Next, 8.4 parts of methyl ethyl ketone were added to the resultant to obtain a 28% photosensitive prepolymer solution (P-5), which corresponds to a solution of the photosensitive prepolymer (B5). The weight-average molecular weight and the acid value of the prepolymer solution (P-5) are 63500 and 47.5 mgKOH/g, respectively.

[Preparation of Photosensitive Prepolymer Solution (P-6)]

40 parts of hydroxypropyl methylcellulose acetate succinate "AS-L" (manufactured by Shin-Etsu Chemical Co., Ltd.), 100 parts of methyl ethyl ketone, 0.05 parts of hydroquinone, 8.7 parts of glycidyl methacrylate and 2.0 parts of dimethyl benzylamine were put in a four-mouth flask, and held at 80° C. for 24 hours. The four-mouth flask has a thermometer, agitator, and a reflux condenser. Next, 9.3 parts of tetrahydrophthalic anhydride and 5.7 parts of methyl ethyl ketone were added to the resultant, and held at 80° C. for 10 hours to obtain a 35% photosensitive prepolymer solution (P-6), which corresponds to a solution of the photosensitive prepolymer (B6). The weight-average molecular weight and the acid value of the prepolymer solution (P-6) are 200000 and 59 mgKOH/g, respectively.

[Preparation of Photosensitive Prepolymer Solution (Q-1)]

150 parts of a styrene-maleic anhydride copolymer "SMA-1000A" (manufactured by ELF ATOCHEM JAPAN, INC.) was dissolved in 149 parts of propylene glycol monomethyl ether acetate at a raised temperature to obtain a first mixture. Next, 51 parts of 2-hydroxyethyl acrylate, 0.1 parts of hydroquinone, and 3.0 parts of dimethyl benzylamine were added to the first mixture under an air flow, and held at 80° C. for 12 hours to obtain a second mixture. 22 parts of n-butanol was added to the second mixture, and held for 24 hours to obtain a 60% photosensitive prepolymer solution (Q-1) for Comparative Example 1. The weight-average molecular weight and the acid value of the prepolymer solution (Q-1) are 7500 and 156 mgKOH/g, respectively.

[Preparation of Photosensitive Prepolymer Solution (Q-2)]

20 parts of methacrylic acid, 80 parts of methyl methacrylate, 100 parts of propylene glycol monomethyl ether acetate, 0.5 parts of lauryl mercaptan and 2 parts of azobis dimethyl valeronitrile were put in a four-mouth flask, and held at 110° C. for 5 hours under a nitrogen flow to obtain a 50% copolymer solution. The four-mouth flask has a thermometer, glass tube for nitrogen substitution, agitator, and a reflux condenser. Next, 15 parts of glycidyl methacrylate, 0.05 parts of hydroquinone and 2.0 parts of dimethyl benzylamine were added to the copolymer solution, and held at 80° C. for 24 hours under an air flow. Then, 11 parts of propylene glycol monomethyl ether acetate were added to the resultant to obtain a 50% photosensitive prepolymer solution (Q-2) for Comparative Example 2. The weight-average molecular weight and the acid value of the prepolymer solution (Q-2) are 18000 and 62 mgKOH/g, respectively.

Examples 1 to 30

Each of the photosensitive resin compositions of Examples 1 to 30 was prepared according to the following method. That is, a mixture prepared according to compounding amounts listed in Tables 1 to 3 was sufficiently agitated by a homomixer, and then heated at 65° C. under an air flow to remove an organic solvent component therefrom, to thereby obtain the photosensitive resin composition of the present invention.

Comparative Examples 1 and 2

Each of photosensitive resin compositions of Comparative Examples 1 and 2 was prepared by mixing the photosensitive prepolymer solution (Q-1) or (Q-2) with the other components according to compounding amounts listed in Table 3, while agitating the resultant.

In Tables 1 to 3, trimethylol propane triacrylate (*1) is "ARONIX M-309" manufactured by Toagosei Co., Ltd. The Phenol denatured monofunctional acrylate (*2) is "ARONIX M-101" manufactured by Toagosei Co., Ltd. The photopolymerization initiator (*3) is "Irgacure 907" manufactured by CIBA-GEIGY CORPORATION. The photopolymerization initiator (*4) is "KAYACURE DETX" manufactured by Nippon Kayaku Co., Ltd. The organic dye (*5) is "VICTORIA PURE BLUE BOH" manufactured by Hodogaya Chemical Co., Ltd.

With respect to Examples 1–30 and Comparative Examples 1 and 2, the following evaluations were performed. Results are shown in Tables 4 to 7.

[1] Thickness of Predried Film

The photosensitive resin composition was applied on both surfaces of an FR-4 double-sided copper clad laminate as a substrate by the use of a vertical roll coater. The clad laminate has a substrate thickness of 1.6 mm and a copper-foil thickness of 35 $\mu$m as a conductive layer. After the clad laminate with the photosensitive resin composition was dried at 80° C. for 15 minutes under a hot-air convention, it was cooled at a room temperature to obtain predried films on the clad laminate. The thickness of the predried film was measured.

[2] Surface Tackiness of Predried Film

A pair of phototool artworks having wiring patterns were directly put on the predried films. The predried films were simultaneously exposed through the phototool artworks by the use of an extra-high-pressure mercury lamp such that the accumulated light-amount is 200 mJ/cm$^2$. After the exposing step, the surface tackiness of the predried film was evaluated by removing the phototool artworks from the predried films. In Tables 4 to 7, the word "Good" used to show a degree of the surface tackiness designates that the phototool artwork was easily removed from the predried film without contamination of the phototool artwork with the photosensitive resin composition.

[3] Developing Property

The developing property of the predried film was evaluated under the following conditions (i) and (ii).

(i) After the exposing step, the predried film was developed by spraying a 1 wt % sodium carbonate aqueous solution thereto at 30° C. at a spray pressure of 1. 5 Kg/cm² for 1 minute, so that the non-exposed portion of the predried film was removed.

(ii) After the exposing step, the predried film was developed by spraying water thereto at 30° C. at a spray pressure of 1. 5 Kg/cm² for 3 minutes, so that the non-exposed portion of the predried film was removed.

In Tables 4 to 7, the symbol "⊚" designates that the non-exposed portion of the predried film was completely removed. The symbol "○" designates that most of the non-exposed portion of the predried film was removed, but a part of the non-exposed portion remained at the boundary between the non-exposed portion and the exposed portion. The symbol "X" designates that the non-exposed portion of the predried film could not be removed.

[4] Adhesion Test (1)

After the exposing and developing step, the adhesion of a cured film (=the exposed portion of the predried film) of the photosensitive resin composition was evaluated. The adhesion test was performed according to Japanese Industrial Standard D 0202-1988, 4.15. In this adhesion test, 100 square cuts were formed in the cured film to obtain 100 square blocks, and then an adhesion tape was put on the 100 square blocks of the cured film. After the adhesion tape was peeled off from the cured film, the number of the remaining blocks of the cured film on the substrate was counted. The adhesion of the cured film was evaluated by a ratio of the number (N) of the remaining blocks to 100 blocks of the cured film. In Tables 4 to 7, the numeral "1" used to show a degree of the adhesion of the cured film designates that the number (N) of the remaining blocks is 100.

[5] Resistance to Etching Solution

The resistance to etching solution means the resistance to an acid aqueous solution of the cured film. After the developing step, an etching treatment of the conductive layer on the substrate with the cured film as a mask was performed with a 40 wt % iron (III) chloride aqueous solution at 45° C. for 240 seconds to obtain a conductive pattern on the substrate. In Tables 4 to 7, the word "good" used to show a degree of the resistance to etching solution designates that there is no occurrence of peeling of the cured film during the etching treatment

[6] Removing Test of Cured Film

With respect to the Examples 1 to 6, 13 to 18, 25, 27, 29, 30 and Comparative Examples 1 and 2, the cured film was stripped and removed by spraying a 3% sodium hydroxide aqueous solution thereto at 45° C. at a spray pressure of 2 kg/cm². On the other hand, with respect to the Examples 7 to 12, 19 to 24, 26, 28 and Comparative Examples 1 and 2, the cured film was stripped and removed by dipping the cured film in a 3% periodic acid aqueous solution at 20° C. for 2 minutes and spraying the aqueous solution thereto at a spray pressure of 2 kg/cm². To evaluate the removing easiness of the cured film, time required to completely strip and remove the cured film was measured, as shown in Tables 4 to 7. In Table 7, the symbol "X" designates that the cured film could not be removed.

[7] Etching Property

After the cured film was stripped and removed, defects of the conductive pattern such as faults, a decrease in line width, pinhole, and a poor linearity of pattern were checked. In Tables 4 to 7, the word "good" used to show the etching property designates that there is no occurrence of such defects of the conductive pattern.

[8] Plating Resistance

After the developing step, the cured film was dipped in a 25 wt % aqueous solution of an agent "PC-455" (manufactured by Meltex Inc.) at 30° C. for 5 minutes for the purpose of degrease. Then, the cured film was washed with water, and was dipped in a 20 wt % aqueous solution of an ammonium persulfate-type soft etching agent "NPE-300" (manufactured by Mitsubishi Gas Chemical Co., Ltd.) at a room temperature for 2 minutes. In addition, the cured film was washed with water, and then it was dipped in a 10 wt % sulfuric acid aqueous solution at a room temperature for 1 minute. Next, the cured film was put in a nickel plating bath containing 300 g of nickel sulfate, 40 g of nickel chloride, 40 g of boric acid and 620 g of water, and a nickel plating was performed at 45° C. at 1.5 A/dm for 10 minutes. After the nickel plating, water washing was performed. Continuously, a gold plating was performed in a gold plating bath of "OROBRIGHT HS-2" (manufactured by JAPAN PURE CHEMICAL CO., LTD) at 40° C. at 1.0 A/dm for 10 minutes. In Tables 4 to 7, the word "good" used to show a degree of the resistance to plating solution designates that there is no occurrence of flaking of the cured film during the plating procedure.

[9] Adhesion Test (II)

After the plating procedure of the item [8], the cured film was washed by water and then dried. The adhesion of the cured film was evaluated according to Japanese Industrial Standard D 0202-1988, 4.15. The brief explanation of this adhesion test was already described in the item [4]. Results are shown in Tables 4 to 7.

[10] Plating Property

After the plating procedure of the item [8], the cured film was stripped and removed from the substrate by spraying a 3% sodium hydroxide aqueous solution thereto at 45° C. at a spray pressure of 2 kg/cm². Then, the occurrence of plating defects was checked by the use of a magnifying glass. In Tables 4 to 7, the word "good" used to show the plating property designates that there is no occurrence of plating defects.

[11] Evaluation of Conductive Pattern

After the cured-film removing step of the item [10], an alkali etching treatment was performed. The linearity of a line pattern of the gold plating was checked by the use of an optical microscope. With respect to all of Examples and Comparative Examples, a distance between the top of a convex portion and the bottom of a concave portion of the gold line pattern is 1 μm or less.

As understood from Tables 4 to 7, the photosensitive resin compositions of the Comparative Examples 1 and 2 can be developed with a diluted alkali aqueous solution, but can not be developed with water. On the contrary, the photosensitive resin compositions of the Examples 1 to 30 can be developed with water as well as the diluted alkali aqueous solution. In addition, the cured film of the photosensitive resin composition of each of the Comparative Examples 1 and 2 can not be stripped and removed from the substrate with the sodium periodate aqueous solution. However, the photosensitive resin compositions of all of Examples of the present invention can be stripped and removed with the sodium periodate aqueous solution as well as the alkali aqueous solution. The other properties of the photosensitive resin compositions of Examples 1 to 30 are substantially the same as those of the Comparative Examples 1 and 2.

In addition, it is confirmed that when the sodium carbonate aqueous solution is used as the developer, the developing property of the photosensitive resin composition of each of the Examples 1 to 24, which contains trimethyl propane triacrylate or phenol denatured monofunctional acrylate as the photopolymerizable ethylenically unsaturated monomer (E) is better than that of each of the Examples 25 to 30, which does not contain the ethylenically unsaturated monomer (E).

From these results, the photosensitive resin composition of the present invention will be preferably used as an etching resist ink, plating resist ink, solder resist ink or a marking ink.

TABLE 1

| Unit: parts by weight | Examples | | | | | | | | | | |
|---|---|---|---|---|---|---|---|---|---|---|---|
| | 1 | 2 | 3 | 4 | 5 | 6 | 7 | 8 | 9 | 10 | 11 |
| Photosensitive resin aqueous solution (S-1) | 350 | 350 | 350 | 350 | 350 | 350 | — | — | — | — | — |
| Photosensitive resin aqueous solution (S-2) | — | — | — | — | — | — | 350 | 350 | 350 | 350 | 350 |
| Photosensitive resin aqueous solution (S-3) | — | — | — | — | — | — | — | — | — | — | — |
| Photosensitive resin aqueous solution (S-4) | — | — | — | — | — | — | — | — | — | — | — |
| 65% prepolymer solution (P-1) | 370 | — | — | — | — | — | 370 | — | — | — | — |
| 60% prepolymer solution (P-2) | — | 420 | — | — | — | — | — | 420 | — | — | — |
| 50% prepolymer solution (P-3) | — | — | 480 | — | — | — | — | — | 480 | — | — |
| 50% prepolymer solution (P-4) | — | — | — | 480 | — | — | — | — | — | 480 | — |
| 28% prepolymer solution (P-5) | — | — | — | — | 685 | — | — | — | — | — | 685 |
| 35% prepolymer solution (P-6) | — | — | — | — | — | 685 | — | — | — | — | — |
| 60% prepolymer solution (Q-1) | — | — | — | — | — | — | — | — | — | — | — |
| 50% prepolymer solution (Q-2) | — | — | — | — | — | — | — | — | — | — | — |
| Trimethylol propane triacrylate (*1) | 50 | 50 | 50 | 50 | 50 | 50 | 50 | 50 | 50 | 50 | 50 |
| Phenol denatured monofunctional acrylate (*2) | 40 | 40 | 40 | 40 | 40 | 40 | 40 | 40 | 40 | 40 | 40 |
| Photopolymerization initiator (*3) | 30 | 30 | 30 | 30 | 30 | 30 | 30 | 30 | 30 | 30 | 30 |
| Photopolymerization initiator (*4) | 5 | 5 | 5 | 5 | 5 | 5 | 5 | 5 | 5 | 5 | 5 |
| Organic dye (*5) | 5 | 5 | 5 | 5 | 5 | 5 | 5 | 5 | 5 | 5 | 5 |
| Hydroquinone | 2 | 2 | 2 | 2 | 2 | 2 | 2 | 2 | 2 | 2 | 2 |
| Dicyandiamide | 0.5 | 0.5 | 0.5 | 0.5 | 0.5 | 0.5 | 0.5 | 0.5 | 0.5 | 0.5 | 0.5 |

TABLE 2

| Unit: parts by weight | Examples | | | | | | | | | | |
|---|---|---|---|---|---|---|---|---|---|---|---|
| | 12 | 13 | 14 | 15 | 16 | 17 | 18 | 19 | 20 | 21 | 22 |
| Photosensitive resin aqueous solution (S-1) | — | — | — | — | — | — | — | — | — | — | — |
| Photosensitive resin aqueous solution (S-2) | 350 | — | — | — | — | — | — | — | — | — | — |
| Photosensitive resin aqueous solution (S-3) | — | 250 | 250 | 250 | 250 | 250 | 250 | — | — | — | — |
| Photosensitive resin aqueous solution (S-4) | — | — | — | — | — | — | — | 230 | 230 | 230 | 230 |
| 65% prepolymer solution (P-1) | — | 370 | — | — | — | — | — | 370 | — | — | — |
| 60% prepolymer solution (P-2) | — | — | 420 | — | — | — | — | — | 420 | — | — |
| 50% prepolymer solution (P-3) | — | — | — | 480 | — | — | — | — | — | 480 | — |
| 50% prepolymer solution (P-4) | — | — | — | — | 480 | — | — | — | — | — | 480 |
| 28% prepolymer solution (P-5) | — | — | — | — | — | 685 | — | — | — | — | — |
| 35% prepolymer solution (P-6) | 685 | — | — | — | — | — | 685 | — | — | — | — |
| 60% prepolymer solution (Q-1) | — | — | — | — | — | — | — | — | — | — | — |
| 50% prepolymer solution (Q-2) | — | — | — | — | — | — | — | — | — | — | — |
| Trimethylol propane triacrylate (*1) | 50 | 50 | 50 | 50 | 50 | 50 | 50 | 50 | 50 | 50 | 50 |
| Phenol denatured monofunctional acrylate (*2) | 40 | 40 | 40 | 40 | 40 | 40 | 40 | 40 | 40 | 40 | 40 |
| Photopolymerization initiator (*3) | 30 | 30 | 30 | 30 | 30 | 30 | 30 | 30 | 30 | 30 | 30 |
| Photopolymerization initiator (*4) | 5 | 5 | 5 | 5 | 5 | 5 | 5 | 5 | 5 | 5 | 5 |
| Organic dye (*5) | 5 | 5 | 5 | 5 | 5 | 5 | 5 | 5 | 5 | 5 | 5 |
| Hydroquinone | 2 | 2 | 2 | 2 | 2 | 2 | 2 | 2 | 2 | 2 | 2 |
| Dicyandiamide | 0.5 | 0.5 | 0.5 | 0.5 | 0.5 | 0.5 | 0.5 | 0.5 | 0.5 | 0.5 | 0.5 |

TABLE 3

| Unit: parts by weight | Examples | | | | | | | | | Comparative Examples | |
|---|---|---|---|---|---|---|---|---|---|---|---|
| | 23 | 24 | 25 | 26 | 27 | 28 | 29 | 30 | | 1 | 2 |
| Photosensitive resin aqueous solution (S-1) | — | — | 350 | — | — | — | 350 | 350 | | — | — |
| Photosensitive resin aqueous solution (S-2) | — | — | — | 350 | — | — | — | — | | — | — |
| Photosensitive resin aqueous solution (S-3) | — | — | — | — | 250 | — | — | — | | — | — |
| Photosensitive resin aqueous solution (S-4) | 230 | 230 | — | — | — | 230 | — | — | | — | — |
| 65% prepolymer solution (P-1) | — | — | 500 | — | — | — | — | — | | — | — |
| 60% prepolymer solution (P-2) | — | — | — | 560 | — | — | — | — | | — | — |

TABLE 3-continued

|  | Examples | | | | | | | | Comparative Examples | |
|---|---|---|---|---|---|---|---|---|---|---|
| Unit: parts by weight | 23 | 24 | 25 | 26 | 27 | 28 | 29 | 30 | 1 | 2 |
| 50% prepolymer solution (P-3) | — | — | — | — | 640 | — | — | — | — | — |
| 50% prepolymer solution (P-4) | — | — | — | — | — | 640 | — | — | — | — |
| 28% prepolymer solution (P-5) | 685 | — | — | — | — | — | 900 | — | — | — |
| 35% prepolymer solution (P-6) | — | 685 | — | — | — | — | — | 900 | — | — |
| 60% prepolymer solution (Q-1) | — | — | — | — | — | — | — | — | 490 | — |
| 50% prepolymer solution (Q-2) | — | — | — | — | — | — | — | — | — | 500 |
| Trimethylol propane triacrylate (*1) | 50 | 50 | — | — | — | — | — | — | 50 | 50 |
| Phenol denatured monofunctional acrylate (*2) | 40 | 40 | — | — | — | — | — | — | 40 | 40 |
| Photopolymerization initiator (*3) | 30 | 30 | 30 | 30 | 30 | 30 | 30 | 30 | 30 | 30 |
| Photopolymerization initiator (*4) | 5 | 5 | 5 | 5 | 5 | 5 | 5 | 5 | 5 | 5 |
| Organic dye (*5) | 5 | 5 | 5 | 5 | 5 | 5 | 5 | 5 | 5 | 5 |
| Hydroquinone | 2 | 2 | 2 | 2 | 2 | 2 | 2 | 2 | 2 | 2 |
| Dicyandiamide | 0.5 | 0.5 | 0.5 | 0.5 | 0.5 | 0.5 | 0.5 | 0.5 | 0.5 | 0.5 |

TABLE 4

|  | Examples | | | | | | | |
|---|---|---|---|---|---|---|---|---|
|  | 1 | 2 | 3 | 4 | 5 | 6 | 7 | 8 |
| Exposing/Developing Step | | | | | | | | |
| Thickness of Predried Film (μm) | 15 | 15 | 15 | 15 | 17 | 17 | 16 | 16 |
| Surface Tackiness of Predried Film | Good | Good | Good | Good | Good | Good | Good | Good |
| Developing Property | | | | | | | | |
| (i) | ◉ | ◉ | ◉ | ◉ | ◉ | ◉ | ◉ | ◉ |
| (ii) | ◉ | ◉ | ◉ | ◉ | ◉ | ○ | ◉ | ◉ |
| Adhesion Test (I) (N/100) | 100 | 100 | 100 | 100 | 100 | 100 | 100 | 100 |
| Etching Step | | | | | | | | |
| Resistance to Etching Solution | Good | Good | Good | Good | Good | Good | Good | Good |
| Removing Test of Cured Film (unit: second) | | | | | | | | |
| (I) | 15 | 10 | 17 | 20 | 30 | 25 | — | — |
| (ii) | — | — | — | — | — | — | 140 | 100 |
| Etching Property | Good | Good | Good | Good | Good | Good | Good | Good |
| Plating Step | | | | | | | | |
| Plating Resistance | Good | Good | Good | Good | Good | Good | Good | Good |
| Adhesion Test (II) (N/100) | 100 | 100 | 100 | 100 | 100 | 100 | 100 | 100 |
| Plating Property | Good | Good | Good | Good | Good | Good | Good | Good |
| Evaluation of Conductive Pattern (μm) | ≦1 | ≦1 | ≦1 | ≦1 | ≦1 | ≦1 | ≦1 | ≦1 |

TABLE 5

|  | Examples | | | | | | | |
|---|---|---|---|---|---|---|---|---|
|  | 9 | 10 | 11 | 12 | 13 | 14 | 15 | 16 |
| Exposing/Developing Step | | | | | | | | |
| Thickness of Predried Film (μm) | 16 | 16 | 18 | 18 | 15 | 15 | 15 | 15 |
| Surface Tackiness of Predried Film | Good | Good | Good | Good | Good | Good | Good | Good |
| Developing Property | | | | | | | | |
| (i) | ◉ | ◉ | ◉ | ◉ | ◉ | ◉ | ◉ | ◉ |
| (ii) | ◉ | ◉ | ◉ | ○ | ◉ | ◉ | ◉ | ◉ |
| Adhesion Test (I) (N/100) | 100 | 100 | 100 | 100 | 100 | 100 | 100 | 100 |
| Etching Step | | | | | | | | |
| Resistance to Etching Solution | Good | Good | Good | Good | Good | Good | Good | Good |
| Removing Test of Cured Film (unit: second) | | | | | | | | |
| (i) | — | — | — | — | 15 | 10 | 17 | 20 |
| (ii) | 160 | 180 | 250 | 200 | — | — | — | — |
| Etching Property | Good | Good | Good | Good | Good | Good | Good | Good |

TABLE 5-continued

|  | Examples | | | | | | | |
|---|---|---|---|---|---|---|---|---|
|  | 9 | 10 | 11 | 12 | 13 | 14 | 15 | 16 |
| Plating Step | | | | | | | | |
| Plating Resistance | Good | Good | Good | Good | Good | Good | Good | Good |
| Adhesion Test (II) (N/100) | 100 | 100 | 100 | 100 | 100 | 100 | 100 | 100 |
| Plating Property | Good | Good | Good | Good | Good | Good | Good | Good |
| Evaluation of Conductive Pattern ($\mu$m) | ≦1 | ≦1 | ≦1 | ≦1 | ≦1 | ≦1 | ≦1 | ≦1 |

TABLE 6

|  | Examples | | | | | | | |
|---|---|---|---|---|---|---|---|---|
|  | 17 | 18 | 19 | 20 | 21 | 22 | 23 | 24 |
| Exposing/Developing Step | | | | | | | | |
| Thickness of Predried Film ($\mu$m) | 17 | 17 | 15 | 15 | 15 | 15 | 17 | 17 |
| Surface Tackiness of Predried Film | Good | Good | Good | Good | Good | Good | Good | Good |
| Developing Property | | | | | | | | |
| (i) | ◎ | ◎ | ◎ | ◎ | ◎ | ◎ | ◎ | ◎ |
| (ii) | ◎ | ○ | ◎ | ◎ | ◎ | ◎ | ◎ | ○ |
| Adhesion Test (I) (N/100) | 100 | 100 | 100 | 100 | 100 | 100 | 100 | 100 |
| Etching Step | | | | | | | | |
| Resistance to Etching Solution | Good | Good | Good | Good | Good | Good | Good | Good |
| Removing Test of Cured Film (unit: second) | | | | | | | | |
| (i) | 30 | 25 | — | — | — | — | — | — |
| (ii) | — | — | 130 | 90 | 150 | 170 | 230 | 190 |
| Etching Property | Good | Good | Good | Good | Good | Good | Good | Good |
| Plating Step | | | | | | | | |
| Plating Resistance | Good | Good | Good | Good | Good | Good | Good | Good |
| Adhesion Test (II) (N/100) | 100 | 100 | 100 | 100 | 100 | 100 | 100 | 100 |
| Plating Property | Good | Good | Good | Good | Good | Good | Good | Good |
| Evaluation of Conductive Pattern ($\mu$m) | ≦1 | ≦1 | ≦1 | ≦1 | ≦1 | ≦1 | ≦1 | ≦1 |

TABLE 7

|  | Examples | | | | | | Comparative Examples | |
|---|---|---|---|---|---|---|---|---|
|  | 25 | 26 | 27 | 28 | 29 | 30 | 1 | 2 |
| Exposing/Developing Step | | | | | | | | |
| Thickness of Predried Film ($\mu$m) | 15 | 16 | 15 | 15 | 17 | 17 | 15 | 15 |
| Surface Tackiness of Predried Film | Good | Good | Good | Good | Good | Good | Good | Good |
| Developing Property | | | | | | | | |
| (i) | ○ | ○ | ○ | ○ | ○ | ○ | ○ | ○ |
| (ii) | ◎ | ◎ | ◎ | ◎ | ◎ | ○ | X | X |
| Adhesion Test (I) (N/100) | 100 | 100 | 100 | 100 | 100 | 100 | 100 | 100 |
| Etching Step | | | | | | | | |
| Resistance to Etching Solution | Good | Good | Good | Good | Good | Good | Good | Good |
| Removing Test of Cured Film (unit: second) | | | | | | | | |
| (i) | 15 | — | 17 | — | 30 | 25 | 15 | 30 |
| (ii) | — | 100 | — | 170 | — | — | X | X |
| Etching Property | Good | Good | Good | Good | Good | Good | Good | Good |
| Plating Step | | | | | | | | |
| Plating Resistance | Good | Good | Good | Good | Good | Good | Good | Good |
| Adhesion Test (II) (N/100) | 100 | 100 | 100 | 100 | 100 | 100 | 100 | 100 |
| Plating Property | Good | Good | Good | Good | Good | Good | Good | Good |
| Evaluation of Conductive Pattern ($\mu$m) | ≦1 | ≦1 | ≦1 | ≦1 | ≦1 | ≦1 | ≦1 | ≦1 |

What is claimed is:

1. A photosensitive resin composition developable with a diluted alkali aqueous solution comprising:
   (A) a water-soluble photosensitive resin selected from the group consisting of a first resin obtained by introducing a styryl pyridinium group into a polyvinyl alcohol polymer, a second resin obtained by introducing a styryl quinolinium group into a polyvinyl alcohol polymer, and a third resin obtained by adding N-alkylol (meth) acrylamide to a polyvinyl alcohol polymer;
   (B) a photosensitive prepolymer having a carboxyl group and at least two photopolymerizable ethylenically unsaturated groups in the molecule;
   (C) a photopylymerization initiator; and
   (D) water,
   wherein a compounding amount of said water-soluble photosensitive resin (A) is in a range of 0.1 to 50 weight % with respect to the total amount of all components of said photosensitive resin composition excluding the amount of water, and a compounding amount of said photosensitive polymer (B) is in a range of 30 weight % or more with respect to the total amount of all components of said photosensitive resin composition excluding the amount of water.

2. The photosensitive resin as set forth in claim 1, further comprising (E) a photopolymerizable ethylenically-unsaturated monomer.

3. A photoresist ink for manufacturing printed wiring boards, comprising the photosensitive resin composition as set forth in claim 2.

4. A predried film obtained by drying the photoresist ink as set forth in claim 3.

5. A predried film obtained by drying the photosensitive resin composition as set forth in claim 2.

6. A photoresist ink for manufacturing printed wiring board, comprising the photosensitive resin composition as set forth in claim 1.

7. A predried film obtained by drying the photoresist ink as set forth in claim 6.

8. A predried film obtained by drying the photosensitive resin composition as set forth in claim 1.

9. The photosensitive resin composition as set forth in claim 1, wherein an acid value of said photosensitive prepolymer (B) is within a range of 20 to 300 mgKOH/g.

* * * * *